US010094864B2

(12) United States Patent
Zaostrovnykh et al.

(10) Patent No.: US 10,094,864 B2
(45) Date of Patent: **\*Oct. 9, 2018**

(54) MEASUREMENT MODULE OF VIRTUAL VECTOR NETWORK ANALYZER

(71) Applicant: Copper Mountain Technologies, LLC, Indianapolis, IN (US)

(72) Inventors: Sergey Aleksandrovich Zaostrovnykh, Chelyabinsk (RU); Vladimir Igorevich Ryzhov, Chelyabinsk (RU); Aleksandr Vladimirovich Bakurov, Chelyabinsk (RU); Igor Anatolyevich Ivashchenko, Chelyabinsk (RU); Alexander Isaac Goloschokin, Indianapolis, IN (US)

(73) Assignee: Copper Mountain Technologies, LLC, Indianapolis, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/075,448

(22) Filed: Mar. 21, 2016

(65) Prior Publication Data

US 2016/0202299 A1 Jul. 14, 2016

Related U.S. Application Data

(63) Continuation of application No. 13/591,124, filed on Aug. 21, 2012, now Pat. No. 9,291,657.

(51) Int. Cl.
*G01R 27/28* (2006.01)

(52) U.S. Cl.
CPC ................... *G01R 27/28* (2013.01)

(58) Field of Classification Search
CPC ........ G01R 27/28; G01R 27/06; G01R 27/04; G01R 27/00; G01R 23/20; G01R 23/16; G01R 23/00; G01R 19/2516; G01R 13/00; G01R 31/08; G01R 31/02; G06F 17/14; G06F 17/142; H04B 17/00; H04B 17/0002; H04B 17/0062
See application file for complete search history.

(56) References Cited

U.S. PATENT DOCUMENTS

| | | | |
|---|---|---|---|
| 7,271,576 B1 * | 9/2007 | O'Harra, II | G01R 27/04 324/73.1 |
| 9,291,657 B2 * | 3/2016 | Zaostrovnykh | G01R 27/28 |

OTHER PUBLICATIONS

McDermott et al., A Low-Cost 100 MHz Vector Network Analyzer with USB Interface, Jul./Aug. 2004, QEX, pp. 3-14.*

* cited by examiner

*Primary Examiner* — Toan Le
(74) *Attorney, Agent, or Firm* — Bradshaw Law LLC

(57) ABSTRACT

A hand-carriable, single port measurement module of a virtual vector network analyzer is sized and configured so as to be directly connectable to devices typically located within confined spaces normally requiring the use of an intervening test cable and which may be closely spaced to other devices that may need to be tested by other measurement modules. The measurement module includes a single test port extending from a housing wherein the housing is elongated along the axis of insertion of the test port and has a length substantially less than 12 inches. A circuit disposed within the housing is configured to transmit and receive test signals through the test port for measurement of a device under test and to transmit digitized signals representing the test signals through a communication interface of the module to a user interface separate from the housing for presentation to a user.

20 Claims, 6 Drawing Sheets

MEASUREMENT MODULE OF VIRTUAL VECTOR NETWORK ANALYZER

RELATED APPLICATION DATA

This application is a continuation of U.S. application Ser. No. 13/591,124 filed Aug. 21, 2012, now U.S. Pat. No. 9,291,657, the contents of which are incorporated by reference.

BACKGROUND

Embodiments relate to vector network analyzers and, in particular, hand-held virtual vector network analyzer measurement modules.

Current vector network analyzers (VNA) exist in either desktop or portable implementations. Desktop VNAs can have built-in user interfaces including displays, keyboards, or the like. The large size of these devices, even in the portable implementation, makes it difficult or impossible to perform measurements immediately on the connectors of the devices-under-test (DUTs) without the use of RF test cables.

In addition, even with precision test cables, a DUT may be located in a relatively confined location such that the VNA cannot be calibrated with the test cables in their final positions, potentially introducing errors into the measurements.

DETAILED DESCRIPTION

In an embodiment, a virtual vector network analyzer measurement module's portability, virtual format, and power draw from a computer interface allows a user to conduct tests directly linking the analyzer test ports and a DUT. The resulting benefit is a considerable enhancement in accuracy; meanwhile, the vector network analyzer (VNA) operation becomes easier and more cost-effective.

Figure 1:
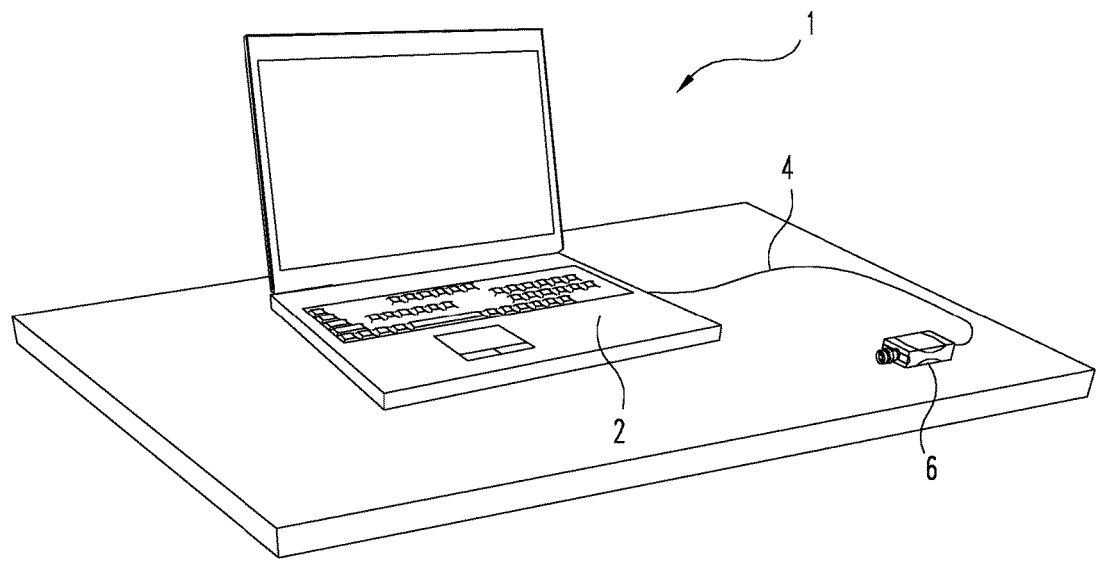
FIG. 1 is a diagram of a vector network analyzer according to an embodiment.

FIG. 1 is a diagram of a VNA according to an embodiment. In this embodiment, a VNA 1 includes a portable measurement module 6 coupled to a computer 2 by a cable 4. The measurement module 6 is configured to generate and receive test signals. The measurement module 6 includes higher-frequency components, such as oscillators, synthesizers, couplers, splitters, bridges, mixers, amplifiers, filters, transmission lines, or the like. These components are configured to generate and measure test signals of the incident wave for transmission out of a test port of measurement module 6 to the DUT and receive test signals of the reflected wave from the DUT through the aforementioned port. As will be described in further detail below, other components of measurement module 6 process the test signals into a format suitable for transmission over cable 4 to personal computer 2.

For example, a synthesizer in the measurement module 6 generates a single frequency incident test signal. That test signal is mixed with a local oscillator signal generated by a second synthesizer, and together they form the IF signal corresponding to the test signal of the incident wave. The incident test signal is also transmitted out of a test port of the measurement module 6. The measurement module 6 receives the incident test signal, reflected off of a DUT, if present, as a reflected test signal. The reflected test signal is mixed with the local oscillator signal, and together they form the IF signal corresponding to the test signal of the reflected wave. These IF incident and reflected test signals are digitized in the measurement module 6. The measurement module 6 is configured to generate a phasor representation of a ratio of the IF incident and reflected test signals. The phasor representation for one or more test signal frequencies are digitized test signals that are transmitted to the computer 2 over the cable 4. Accordingly, a position, movement, deterioration, or the like of components between the measurement module 6 and the computer 2 will not have any effect on the measurement accuracy.

The cable 4 is associated with a power and communication interface. In this embodiment, the cable 4 is a universal serial bus (USB) cable. A corresponding USB port of the computer 2 provides both communications and power to the measurement module 6.

The digitized signals are transmitted to the computer 2 through the cable 4. Accordingly, the user interface of the VNA 1, such as a display, keyboard, buttons, knobs, other processing circuitry, or the like, is separate from a housing including a test port of the measurement module 6. As a result, the measurement module 6 is smaller than a conventional device integrated with the user interface.

The computer 2 is configured to present a user interface for manipulating the magnitude and phase signals and/or any derived information. For example, the computer 2 is configured to present a display of phase, magnitude, delay, or the like of the received signals in response to user input. The computer 2 is configured to present the information in Cartesian graphs, Smith charts, or the like.

Since the user interface is located at the computer 2, user interface components are not present at the measurement module 6, thus reducing a size and power consumption of the measurement module 6. The smaller size allows the measurement module 6 to be directly connected to a device under test (DUT). That is, no test cables are needed. In contrast, if the measurement module 6 was integrated with the user interface, test cables would be required to couple to a DUT.

By eliminating the need for a test cable, any variation in measurement due to the test cables, such as variations due to environmental changes, movement of the test setup, or the like is eliminated. For example, when the VNA 1 is calibrated, the calibration is performed at the test port mounted to the measurement module 6. Since any circuitry, cables, transmission lines, or the like between the connector of the measurement module 6 and any sensing circuitry is contained within a housing of the measurement module 6, movement of the measurement module 6 will have a substantially reduced, if not negligible effect on the calibration of the VNA 1.

The cable 4 allows for flexibility in positioning the measurement module 6 that both accommodates positions available by using a test cable and positions prohibited by a test cable. For example, a DUT is located in a physically constrained location, such as within a cabinet, a vehicle chassis, or the like. Routing and manipulation of the cable 4 when attaching the measurement module 6 does not substantially affect a calibration of the VNA 1 since the interface cable 4 need not be a precision test cable. Accordingly, costs to locate the test port of the VNA 1 at a desired location are reduced.

Although a computer 2 has been given as an example, other types of devices can be used. For example, a laptop computer, desktop computer, test and measurement instrument, tablet computer, smartphone, or the like can be used. Any device with a suitable communication interface through which power is provided may be used.

Although a USB cable has been given as an example of the cable 4, other cables and interface systems can be used to enable communication and supply power. In another embodiment, the computer 2 is configured to provide a power-over-Ethernet connection. The power and communication interface is any communication interface that supplies power, whether through separate connections of the cable 4 or multiplexed with the communication signals.

Figure 2:
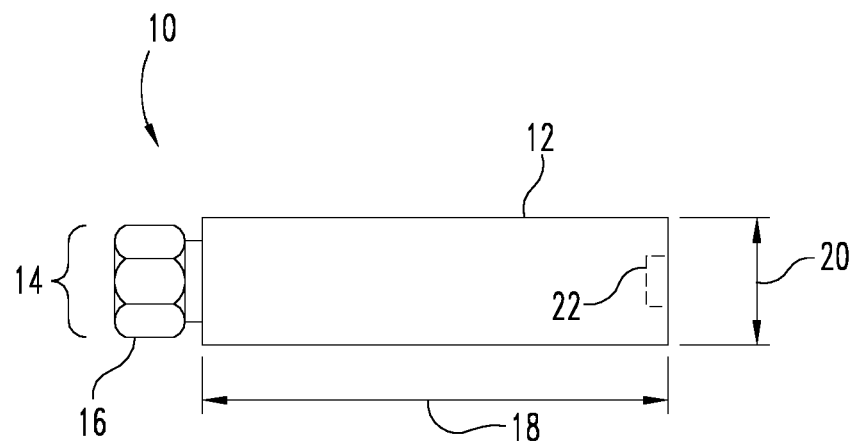
FIGS. 2-4 illustrate a vector network analyzer measurement module according to another embodiment.
Figure 3:
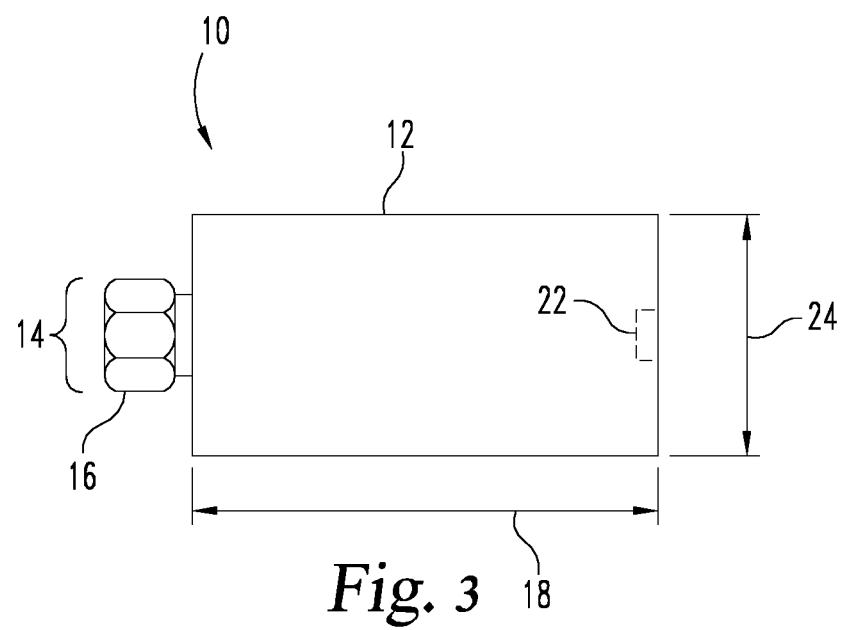
Figure 4:
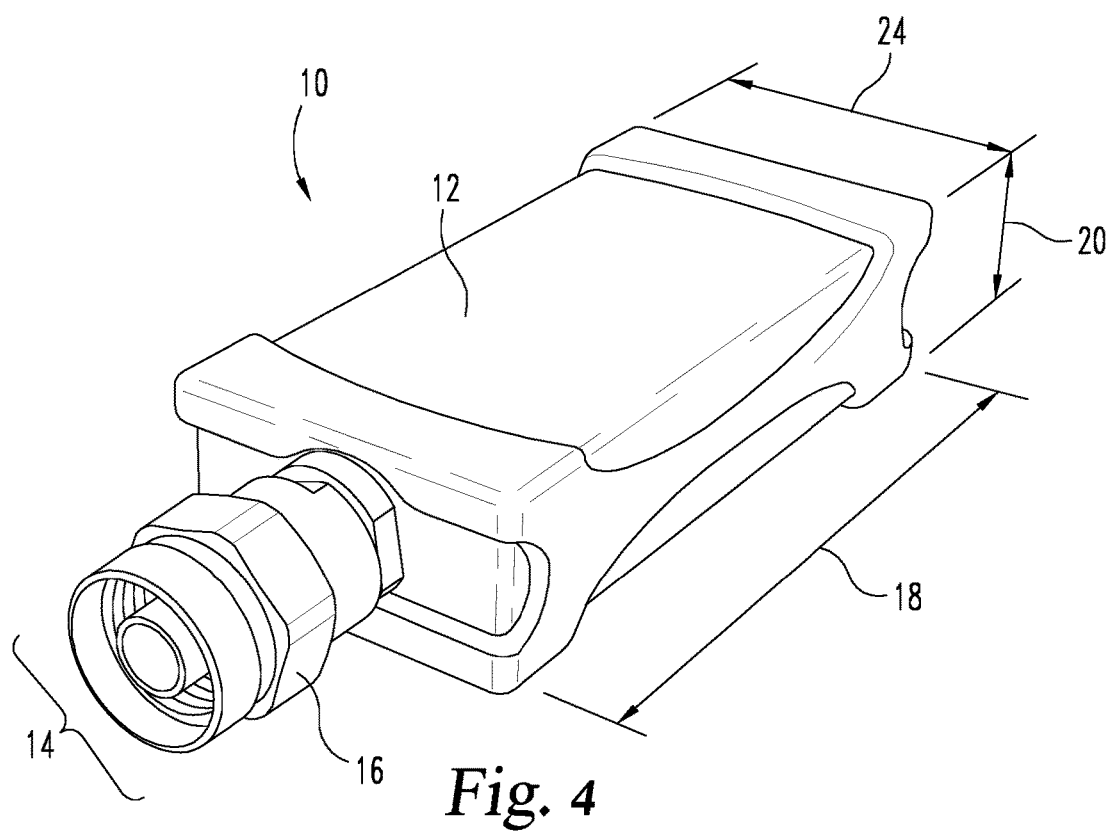

FIGS. 2-4 illustrate a vector network analyzer measurement module 10 according to another embodiment. The measurement module 10 includes a housing 12 with a test port 14 mounted on the housing. A power and communication interface 22 is disposed opposite the test port 14. In another embodiment, the interface 22 is disposed in other locations where the interface 22 and any connecting cable do not interfere with the test port 14 and mounting the test port 14 to a DUT.

The housing 12 defines a first dimension 20 that is preferably less than about 2 inches. In an embodiment, the first dimension is less than about 1 inch. The housing 12 has a second dimension 24 that is preferably less than about 1.5 inches. In the illustrated embodiment, the first dimension 20 and second dimension 24 are the smallest major dimensions of the housing 12.

The dimensions 20 and 24 are dimensions of the measurement module 10 allow a user to grip the measurement module 10 substantially within the user's hand. In an embodiment, the length of a perimeter substantially formed by dimensions 20 and 24 is less than about 12 inches, and preferably less than about 5 inches.

In an embodiment, dimensions 20 and 24 are substantially perpendicular with the insertion axis defined by the test port 14. Accordingly, a cross-section of the housing 12 is smaller, allowing the measurement module to be attached to a DUT within a confined space. When DUTs are closely spaced, movement in a plane substantially perpendicular with an insertion axis of a port of the DUT is limited. Accordingly, the reduced cross-sectional size of the housing allows the measurement module 10 to be directly connected to a DUT in such an environment.

In an embodiment, a third dimension 18 of the housing is less than about 5 inches. Accordingly, the housing 12 fits comfortably in a user's hand. When a user holds the housing 12 in one hand, the user attaches the test port 14 to a DUT using the other hand, for example, with an appropriate torque wrench. The dimensions described above result from separating the user interface device from high frequency circuitry within the measurement module 10.

Figure 5:
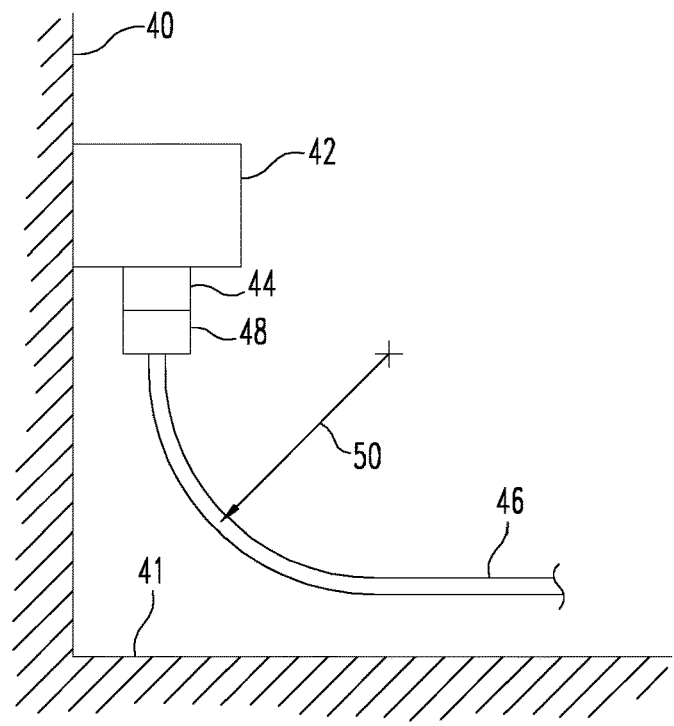
FIG. 5 illustrates a test cable attached to a device-under-test in an enclosure.

FIG. 5 illustrates a test cable attached to a device-under-test in an enclosure. In an embodiment, a DUT 42 is mounted in an enclosure 40. The enclosure 40 has a surface 41, such as a wall, shelf, panel, or the like, that least partially obstruct access to a connector 44 of the DUT 42.

As illustrated, a test cable 46 with connector 48 is coupled to the connector 44 of the DUT 42. Test cables 46 have a specified minimum bend radius below which performance of the cable 46 is undefined. Accordingly, when coupling the test cable 46 to the DUT 42, the bend radius 50 may approach the test cable's 46 minimum bend radius due to the confines of the space.

In addition, a calibration must be performed at the connector 48 to substantially eliminate effects of the cable. However, it is impractical to calibrate the VNA at the connector 48 inside of the enclosure 40, particularly with the cable 46 in substantially the same position as when coupled to the DUT 42. Thus, the calibration must be performed outside of the enclosure 40. As a result, the test cable 46 will not have the same physical characteristics such as position, bend radius, or the like between when the VNA is calibrated and when the test cable 46 is coupled to the DUT 42. Thus, errors in measurements are introduced.

Figure 6:
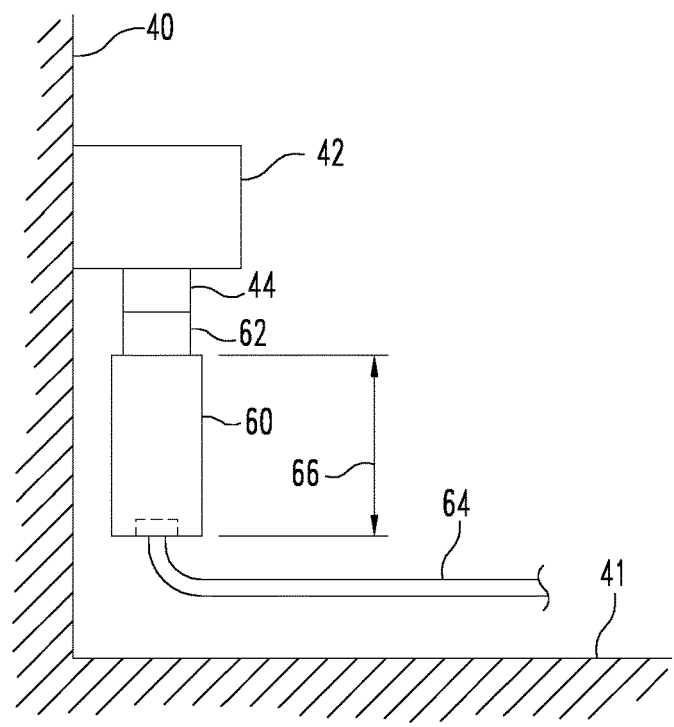
FIG. 6 illustrates a vector network analyzer attached to a device-under-test in an enclosure according to an embodiment.

FIG. 6 illustrates a vector network analyzer attached to a device-under-test in an enclosure according to an embodiment. In this embodiment, a measurement module 60 is directly coupled to the DUT 42. Connector 62 of the measurement module 60 is directly connected to the connector 44 of the DUT 42.

In this embodiment, a dimension 66 of the housing of the measurement module 60 along an axis of insertion of the DUT connector 44 is less than a minimum bend radius of cable operable over a frequency range including a frequency range of the vector network analyzer. That is, the position of the DUT 42 accommodates a test cable with a bend approaching the minimum bend radius. Since the size of the measurement module 60 is smaller than the minimum bend radius, the measurement module can be inserted into the same space and coupled to the DUT 42.

Moreover, the measurement module 60 is calibrated outside of the enclosure 40. In contrast to the test cable 46, moving the measurement module 60 into the enclosure 40 will not substantially change the conditions under which the measurement module 60 was calibrated. That is, the calibration was performed at the connector 62. The connector 62 is substantially rigidly mounted to the housing of the measurement module 60. Thus, substantially no relative motion will occur between the calibrated port and the sensing circuitry. Any movement, change in position, or the like of cable 64 will not affect the calibration since only digitized signals are transmitted over the cable 64.

In an embodiment, locating the user interface external to the housing 12 results in a measurement module 10 that is lighter than a conventional VNA. The absence of components like the display, power supply, keyboard, and the housing necessary for their containment, eliminates additional weight to the measurement module 10. In an embodiment, the VNA-measurement module 10 weighs less than about 250 g.

Figure 7:
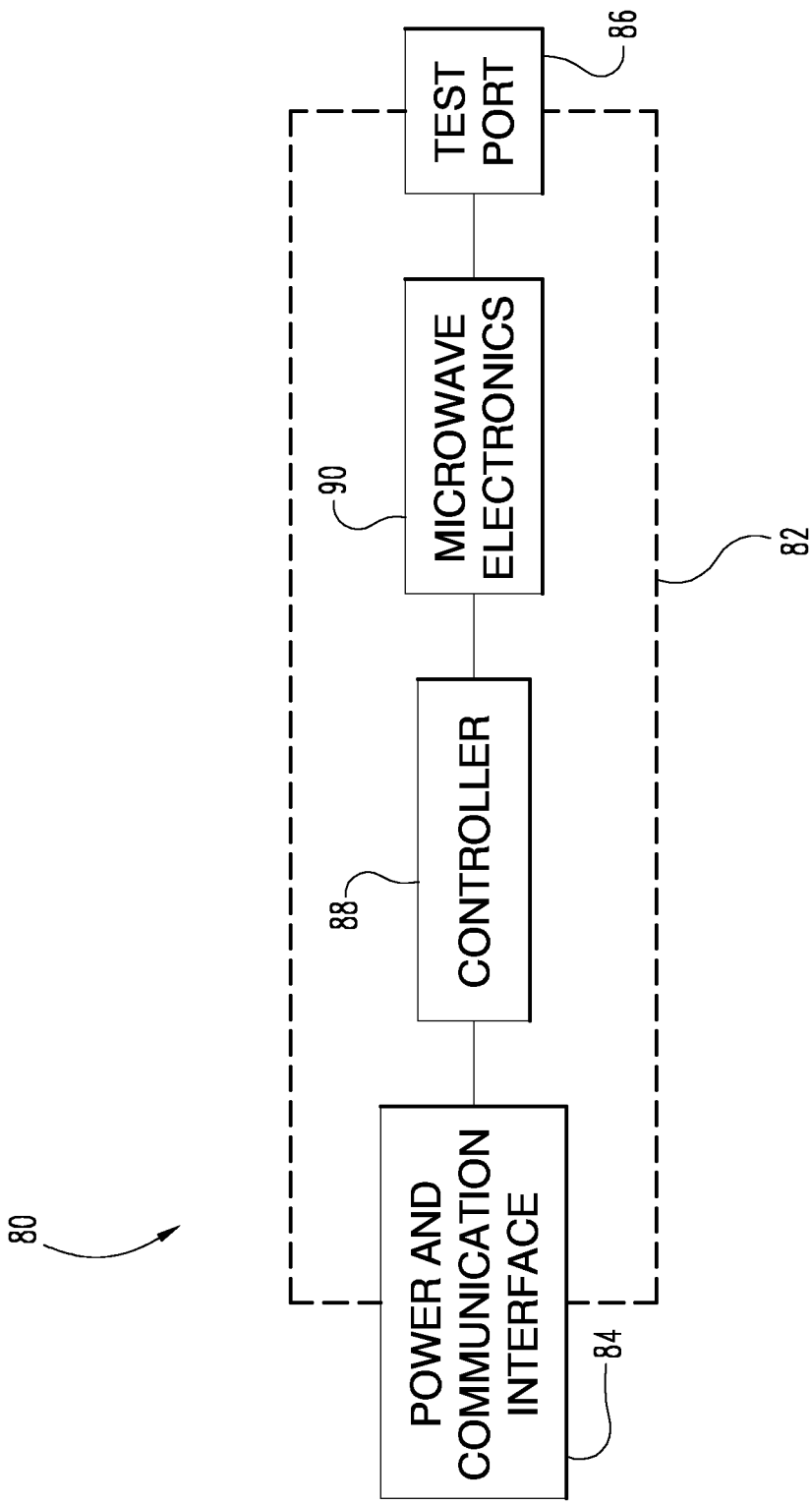
FIG. 7 is a block diagram of a vector network analyzer measurement module according to an embodiment.

FIG. 7 is a block diagram of a vector network analyzer measurement module according to an embodiment. In this embodiment, the measurement module 80 includes a housing 82. A power and communication interface 84 and a test port 86 are mounted on the housing. The measurement module 80 also includes a controller 88 and microwave electronics 90.

The microwave electronics 90 are configured to generate an incident signal to transmit through the test port 86 and receive a reflected signal through the test port 86. The microwave electronics 90 include synthesizers, mixers, couplers, splitters, resistive bridges, or the like for generating and processing incident test signals and received test signals, whether reflected off of another device or transmitted from another measurement module. In an embodiment, the microwave electronics 90 include the circuitry to generate test signals and convert both transmitted and received test signals into lower frequency intermediate frequency (IF) signals and/or phasor representations. That is, high frequency circuitry and connections for signals needing a signal path that is affected by geometry, position, motion, or the like is contained within the measurement module 82.

The controller 88 is configured to receive such IF signals or similar signals and generate digitized signals for transmission through the power and communication interface 84. In an embodiment, the controller 88 includes a general purpose processor, an application specific integrated circuit, a digital signal processor, a programmable logic device, a combination of such circuits, or the like. In an embodiment the controller 88 includes integrated analog to digital converters, data ports for external analog to digital converters, or the like. In addition, the controller 88 includes integrated communication interfaces such as USB ports, Ethernet ports, external implementations of such ports, or the like.

The measurement module 80 is configured to obtain power from the power and communication interface 84. That is, the power for the controller 88 and microwave electronics 90 is obtained through the power and communication interface. In this embodiment, no other power supply is present.

Figure 8:
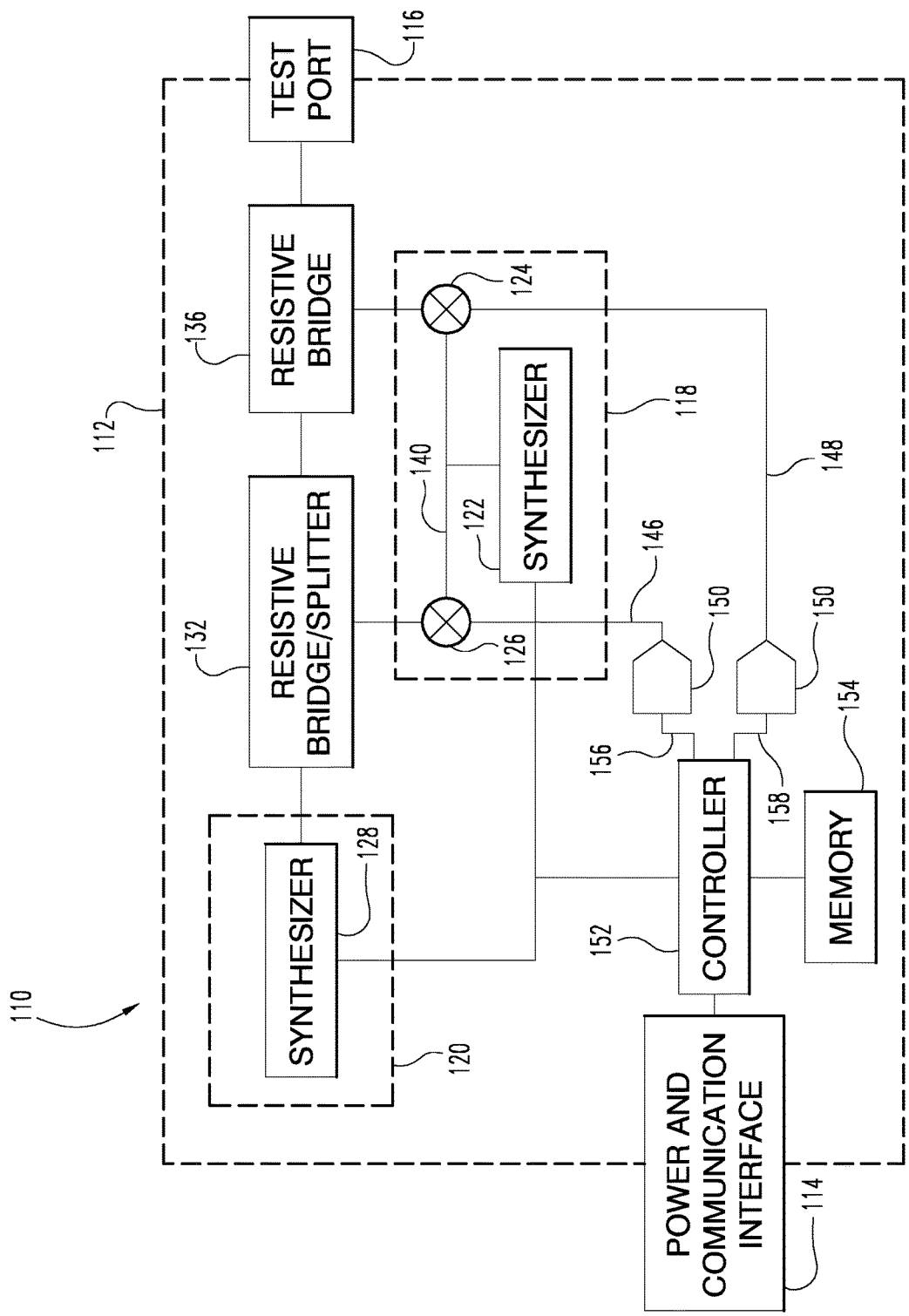
FIG. 8 is a block diagram of a vector network analyzer measurement module according to another embodiment.

FIG. 8 is a block diagram of a vector network analyzer measurement module according to another embodiment. The measurement module 110 includes a test port 116 and a power and communication interface 114 mounted on a housing 112 similar to a measurement module described above. In this embodiment, the measurement module 110 includes a first synthesizer 128 and a second synthesizer 122.

The first synthesizer 128 is formed in an integrated circuit 120. The first synthesizer 128 includes one or more oscillators, frequency dividers, frequency multipliers, attenuators, amplifiers, filters, or the like to generate a desired signal. In particular, the first synthesizer 128 is used to generate an incident signal for the measurement module 110.

The first synthesizer 128 is coupled to the controller 152. The controller 152 is configured to set various parameters of the incident signal, such as frequency power, dividing/multiplying ratio, or the like.

The incident signal is provided to a resistive bridge or splitter 132. In an embodiment a resistive bridge couples the incident signal to the resistive bridge 136 and a mixer 126. Accordingly, the incident signal is transmitted out of the test port 116 and downconverted through the mixer 126 for measurement.

The measurement module 110 includes a second synthesizer 122. The second synthesizer 122 is formed in an integrated circuit 118. The second synthesizer 122 includes one or more oscillators, frequency dividers, frequency multipliers, attenuators, amplifiers, filters, or the like to generate a desired signal. In addition, the integrated circuit 118 including the second synthesizer 122 includes mixers 124 and 126. In particular, the second synthesizer 122 is configured to generate a local oscillator signal for mixers 124 and 126.

The second synthesizer 122 is coupled to the controller 152. The controller 152 is configured to set various parameters of the incident signal, such as frequency power, dividing/multiplying ratio, or the like. Accordingly, the controller 152 is configured to set parameters of the incident signal from the first synthesizer 128 and the local oscillator signal from the second synthesizer 122 such that the incident signal and a reflected signal are downconverted to a desired IF signal frequency range. That is, the incident signal is downconverted in the mixer 126 and the reflected signal received through the test port 116 is coupled to the mixer 124 through the resistive bridge 136 and downconverted to the desired IF signal frequency range. The controller 152 is configured to sweep frequencies of the first synthesizer and the second synthesizer and substantially maintain a frequency offset between the incident signal and the local oscillator signal. In another embodiment, the controller 152 is configured to receive commands through the power and communication interface 114 to control a sweep of test signals.

Although a splitter and resistive bridge have been used as examples, in an embodiment, other components and structures are used to isolate signals. For example, circulators, couplers, a combination of such components, or the like are used to route the incident and reflected signals.

In an embodiment, an IF incident signal 146 and an IF reflected signal 148 are digitized in digitizers 150. The controller 152 is configured to further process the digitized signals 156 and 158 for storage in the memory 154, transmission through the power and communication interface 114, or the like. In an embodiment, the controller 152 is configured to convert the IF signals into a phasor representation of the reflected signal using the incident signal as a reference. Coefficients from a calibration are applied by the controller 152 or at a later time after transmission. In another example, the digitized IF signals are transmitted through the power and communication interface 114. A user interface is configured to apply a correction for a calibration. That is, once the high frequency signals are converted into lower frequency and/or digital signals, any amount of processing of the signals are distributed between the measurement module 110 and a user interface from complete processing of the signals at the user interface to complete processing of the signals at the measurement module. However, the presentation of any resulting measurements occurs at the user interface, separate from the measurement module.

In an embodiment, the digitizers 150 are integrated with the controller 152. For example, a microcontroller, application specific integrated circuit, or the like includes integrated analog to digital converters. In addition, at least a part of the power and communication interface 114 is included in the controller. In an embodiment, the controller 152 includes a communication portion of a USB interface. Accordingly, size, weight, power consumption, or the like is reduced by using such integrated components described above.

In an embodiment, the memory 154 is any variety of memory. For example, the memory 154 includes static memory, dynamic memory, flash memory, an electrically erasable programmable read only memory (EEPROM), a combination of such memories, or the like. In an embodiment. the memory 154 is configured to store factory correction coefficients, user calibration coefficients and the software for installation onto an external user interface to control the measurement module 110. In an embodiment, the memory 154 is separate from the controller 152, integrated with the controller 152, a combination of external and internal memory, or the like.

Although a single synthesizer 128 has been described for generating an incident signal, in an embodiment, multiple synthesizers, oscillators, or the like are present. For example, an additional synthesizer is present to increase the measurement range of the measurement module. Additional test signal amplifiers, frequency multipliers, frequency dividers, attenuators, filters, switches, or the like are present.

In an embodiment, the measurement module 110 includes a reference frequency generator, a programmable automatic frequency control, a reference frequency input, or the like. The synthesizers 122 and 128 are configured to be phase locked to such a reference frequency signal.

In an embodiment, a measurement range of the measurement module 128 is extended. The mixers 124 and 126 are driven with a local oscillator signal having a frequency that is one third of a sum or difference of a frequency of the incident signal and an intermediate frequency signal. A third harmonic of such a local oscillator signal, generated in the mixer, downconverts the higher frequency incident signal. Accordingly, smaller, lower frequency components are used for a higher operating frequency range. As a result, the size, weight, power consumption, or the like of the measurement module 110 can be reduced.

In an embodiment, integrating the higher frequency components allows for a smaller footprint, yet a higher frequency range. For example, with the integrated circuits 118 and 120 described above, the frequency range of the measurement module can be extended up to about 5 GHz or greater, for example up to at least 5.4 GHz. In another example, the upper frequency limit can be about 13 GHz or greater, for example, at least about 13.5 GHz.

Figure 9:
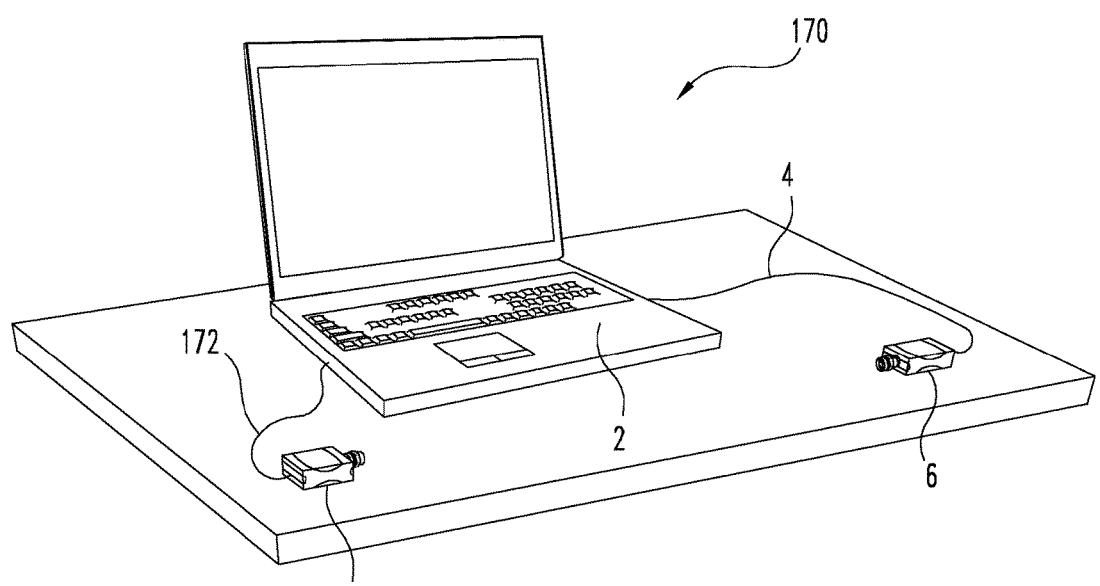
FIG. 9 is a diagram of a vector network analyzer according to another embodiment.

FIG. 9 is a block diagram of a vector network analyzer according to another embodiment. As described above, the measurement module 6 is used as a vector reflectometer. That is, measurement module 6 is used as part of a single port vector network analyzer. In another embodiment, multiple measurement modules are used to create a multi-port VNA.

In this embodiment, a VNA 170 is configured similar to the VNA 1 of FIG. 1. However, an additional measurement module 174 is coupled to the computer 2 with a cable 172 similar to the cable 4. Accordingly, test signals are generated from either measurement modules 6 and 174. Using the measurement module 6 as an example for generating an incident signal, the incident signal is transmitted through a DUT (not shown) to the measurement module 174.

Accordingly, the measurement module 174 measures the transmitted, incident signal. For example, the measurement module 174 measures a magnitude of the transmitted incident signal. That is, the measurement module 174 operates as a scalar test analyzer.

In another example, the measurement module 174 is configured to receive the transmitted incident signal and generate an internal reference signal. For example, a reference signal, such as a 10 MHz reference signal, can be used to synchronize the measurement modules 6 and 174 to phase lock the internal reference signal to the incident signal. Accordingly, a phase locked local oscillator signal within the measurement module 174 is generated to downconvert a received incident signal to an IF frequency range. In another example, the synchronization can be implemented with a programmable automatic frequency control.

In an embodiment, the user interface is provided by the computer 2. Accordingly, the VNA 170 operates as a conventional two-port VNA, albeit without various constraints as described above. However, the computer 2 need not be the interface for the measurement modules. In an embodiment, in a manufacturing setup, a test instrument has several measurement modules. Each of the measurement modules operate substantially independently as reflectometers, or in conjunction as multi-port test setups. To transition from a single-port or two-port setup to a multi-port setup of multiple single or two port setups, a user need only acquire additional measurement modules, rather than purchasing an entire new instrument or an entire new multi-port test set.

In an embodiment, multiple reflectometers, two-port setups, and multi-port setups, are coupled to the same user interface. In an embodiment, a computer has multiple USB ports, each of which is coupled to a USB hub with multiple ports. Each terminal USB port is coupled to an associated measurement module. Although a USB hub has been used as an example, any switch, router, computer, or other communication device is used to distribute measurement modules in desired location.

Although particular embodiments have been described above, the scope of the following claims is not limited to these embodiments. Various modifications, changes, combinations, substitution of equivalents, or the like is made within the scope of the following claims.

The invention claimed is:

1. A hand-carriable, single port measurement module of a virtual vector network analyzer that is sized and configured so as to be directly connectable to devices typically located within confined spaces normally requiring the use of an intervening test cable and which are closely spaced to other devices that need to be tested by other measurement modules, wherein the measurement module comprises:
   a single test port extending from one end of an elongated housing, the housing containing a circuit that is configured to:
   transmit and receive test signals through the test port for measurement of a device under test; and
   transmit digitized signals representing the test signals through a communication interface of the measurement module to a user interface that is separate from the housing for presentation to a user;
   wherein the housing defines a first dimension along an axis of insertion of the test port and second and third dimensions that are each transverse to the axis of insertion;
   wherein the first dimension is substantially less than 12 inches;
   wherein the second and third dimensions are each substantially less than the first dimension; and
   wherein the length of a perimeter of the housing substantially formed by the second and third dimensions is substantially less than 12 inches;
   whereby the dimensions of the housing allow the measurement module to fit comfortably in a user's hand and be directly connected to a typical device under test without the need for an intervening test cable.

2. The measurement module of claim 1 wherein the first dimension is less than 6 inches.

3. The measurement module of claim 1 wherein the first dimension is about 5 inches.

4. The measurement module of claim 1 wherein at least one of the second and third dimensions is about 2 inches or less.

5. The measurement module of claim 4 wherein the second and third dimensions are each about 2 inches or less.

6. The measurement module of claim 4 wherein the length of the perimeter substantially formed by the second and third dimensions is less than 8 inches.

7. The measurement module of claim 1 wherein the communication interface is mounted to an end of the housing that is opposite the test port.

8. The measurement module of claim 7 wherein the communication interface comprises a power and communication interface.

9. The measurement module of claim 1 wherein the circuit is configured to:
generate a local oscillator signal;
generate a digitized incident wave intermediate frequency signal in response to a synthesized incident wave test signal and the local oscillator signal;
generate a digitized reflected wave intermediate frequency signal in response to a reflected signal received through the test port and the local oscillator signal;
generate a phasor representation of a ratio of the digitized incident wave intermediate frequency signal and the digitized reflected wave intermediate frequency signal; and
transmit the phasor representation as one of the digitized signals.

10. The measurement module of claim 1 wherein the circuit comprises:
microwave electronics coupled to the test port; and
a controller configured to digitize signals from the microwave electronics and transmit the digitized signals through the communications interface.

11. The measurement module of claim 10 wherein the microwave electronics further comprise:
a first integrated circuit including a first synthesizer configured to generate an incident wave signal; and
a second integrated circuit including a first mixer, a second mixer, and a second synthesizer configured to generate a local oscillator signal; wherein:
the first mixer is configured to receive the incident wave signal and the local oscillator signal; and
the second mixer is configured receive a reflected wave signal from the test port and the local oscillator signal.

12. The measurement module of claim 11 wherein the microwave electronics further comprise:
a first resistor bridge configured to provide the incident wave signal to the first mixer and the test port; and
a second resistor bridge configured to provide the reflected wave signal from the test port to the second mixer.

13. The measurement module of claim 11 wherein the first mixer and the second mixer are configured to use a third harmonic of the local oscillator signal.

14. The measurement module of claim 1 wherein the communication interface comprises a universal serial bus interface.

15. The measurement module of claim 1 further comprising a memory configured to store factory correction coefficients and user calibration coefficients.

16. The measurement module of claim 1 in combination with a memory storing software that, when installed on a computer external to the measurement module, causes the computer to present a user interface for the virtual vector network analyzer.

17. A vector network analyzer comprising the measurement module of claim 1 in combination with a user interface that is separate from the housing of the measurement module and is configured to receive the digitized signals representing the test signals from the communications interface of the measurement module.

18. The vector network analyzer of claim 17 wherein the user interface is configured to transmit control signals to the measurement module to control the test signals transmitted by the measurement module.

19. The measurement module of claim 1 wherein the first dimension is less than 6 inches, at least one of the second and third dimensions is about 2 inches or less, and the communication interface comprises a universal serial bus interface.

20. The measurement module of claim 19 wherein the measurement module draws its power through the universal serial bus interface.

* * * * *